(12) United States Patent
Choi et al.

(10) Patent No.: US 10,295,599 B2
(45) Date of Patent: May 21, 2019

(54) APPARATUS AND METHOD FOR MONITORING MAGNET FLUX DEGRADATION OF A PERMANENT MAGNET MOTOR

(71) Applicant: GM GLOBAL TECHNOLOGY OPERATIONS LLC, Detroit, MI (US)

(72) Inventors: Gilsu Choi, Shelby Township, MI (US); Anno Yoo, Rochester Hills, MI (US); Dwarakanath V. Simili, Oakland Township, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 15/674,804

(22) Filed: Aug. 11, 2017

(65) Prior Publication Data

US 2019/0049517 A1    Feb. 14, 2019

(51) Int. Cl.
| | | |
|---|---|---|
| *H02P 21/08* | (2016.01) | |
| *H02P 23/14* | (2006.01) | |
| *H02P 25/16* | (2006.01) | |
| *G01R 31/34* | (2006.01) | |
| *G01R 31/3842* | (2019.01) | |
| *G01R 31/367* | (2019.01) | |
| *B60L 3/00* | (2019.01) | |

(52) U.S. Cl.
CPC .......... *G01R 31/343* (2013.01); *B60L 3/0061* (2013.01); *G01R 31/367* (2019.01); *G01R 31/3842* (2019.01)

(58) Field of Classification Search
CPC ........... H02P 21/08; H02P 23/14; H02P 25/16

USPC ........................................ 318/492, 798, 812
See application file for complete search history.

(56) References Cited

U.S. PATENT DOCUMENTS

| | | | |
|---|---|---|---|
| 6,573,745 B2 | 6/2003 | Raftari et al. | |
| 6,822,418 B2 | 11/2004 | Harke | |
| 7,531,982 B2 | 5/2009 | Okamura et al. | |
| 8,610,452 B2 | 12/2013 | Lee et al. | |
| 8,633,663 B2 | 1/2014 | Sonoda et al. | |
| 2011/0163709 A1* | 7/2011 | Dai .......................... | H02P 21/06 318/812 |
| 2014/0015468 A1* | 1/2014 | Jang ........................ | H02P 21/06 318/798 |

* cited by examiner

*Primary Examiner* — Eduardo Colon Santana
*Assistant Examiner* — Cortez Cook
(74) *Attorney, Agent, or Firm* — Lorenz & Kopf, LLP

(57) ABSTRACT

A method in a motor controller for an electric motor is disclosed. The method includes receiving a motor current measurement, a motor reference voltage or measured voltage, and an estimated temperature from the electric motor, determining a reference flux linkage estimate ($\lambda$pm,ref) from a lookup table based on the motor current measurement and the estimated temperature, determining a back-EMF (electromotive force) estimate based on the motor current measurement, the motor voltage and the estimated temperature, determining an observed flux linkage estimate ($\lambda$pm, obs) from the back-EMF estimate, determining a magnetic strength as a ratio of the observed flux linkage estimate to the reference flux linkage estimate, and determining that a rotor magnet has been demagnetized to an unacceptable level when the magnetic strength is below a threshold level.

20 Claims, 4 Drawing Sheets

APPARATUS AND METHOD FOR MONITORING MAGNET FLUX DEGRADATION OF A PERMANENT MAGNET MOTOR

TECHNICAL FIELD

The technical field generally relates to estimating the magnetization state of magnets in a permanent magnet motor, and more particularly relates estimating the magnetization state of magnets in a permanent magnet motor by observing magnet flux as a state variable.

INTRODUCTION

The propulsion system in an electric vehicle includes a permanent magnet electric motor that includes a rotor portion containing a permanent magnet and a stator. The strength of the rotor magnet flux determines the amplitude of magnet-produced torque. The amount of torque is, therefore, determined by the magnet strength. The magnet strength, however, may degrade over time due to a number of factors including excessively large magnetizing current from the stator side and an operating temperature of the magnet that is too high.

Accordingly, it is desirable to monitor the magnetization state of the magnet before any significant degradation of propulsion and control performance. Furthermore, other desirable features and characteristics of the present invention will become apparent from the subsequent detailed description and the appended claims, taken in conjunction with the accompanying drawings and the foregoing technical field and background.

SUMMARY

A method in a motor controller for an electric motor is disclosed. In one embodiment, the method includes receiving a motor current measurement, a motor reference voltage or measured voltage, and an estimated temperature from the electric motor, determining a reference flux linkage estimate ($\lambda_{pm,ref}$) from a lookup table based on the motor current measurement and the estimated temperature, determining a back-EMF (electromotive force) estimate based on the motor current measurement, the motor voltage and the estimated temperature, determining an observed flux linkage estimate ($\lambda_{pm,obs}$) from the back-EMF estimate, determining a magnetic strength as a ratio of the observed flux linkage estimate to the reference flux linkage estimate, and determining that a rotor magnet has been demagnetized to an unacceptable level when the magnetic strength is below a threshold level.

In one embodiment, determining a reference flux linkage estimate ($\lambda_{pm,ref}$) from a lookup table based on the motor current measurement and the estimated temperature includes determining the reference flux linkage estimate using a pre-defined flux lookup table and a temperature coefficient.

In one embodiment, determining a reference flux linkage estimate ($\lambda_{pm,ref}$) includes selecting an entry from a lookup table wherein a d-axis current ($i_d$) is equal to zero and a q-axis current ($i_q$) is equal to the amplitude of a stator excitation current ($I_{ss}$).

In one embodiment, determining a reference flux linkage estimate ($\lambda_{pm,ref}$) includes multiplying the selected entry from the lookup table by a temperature coefficient (Br coeff) wherein the Br coeff is calculated using a measured magnet material property from the rotor magnet.

In one embodiment, determining the back-EMF estimate based on the motor current measurement, the motor voltage and the estimated temperature includes: calculating a flux increment based on the motor current measurement, the motor voltage, and the estimated temperature, calculating a flux error by differencing an estimated flux and a measured flux, and determining the back-EMF estimate using the calculated flux increment and the calculated flux error.

In one embodiment, determining the observed flux linkage estimate ($\lambda_{pm,obs}$) using the back-EMF estimate includes determining the observed flux linkage estimate using a d-axis back-EMF voltage estimate in the synchronously rotating reference frame ($\hat{e}^r_{ds}$) and a q-axis back-EMF voltage estimate in the synchronously rotating reference frame ($\hat{e}^r_{qs}$).

In one embodiment, the observed flux linkage estimate ($\lambda_{pm,obs}$) is determined by $\lambda_{pm,obs} = \sqrt{(\hat{e}^r_{ds})^2 + (\hat{e}^r_{qs})^2}/\omega_e$ wherein $\omega_e$ is the electrical angular speed.

In one embodiment, determining the magnetic strength as a ratio of the observed flux linkage estimate to the reference flux linkage estimate includes multiplying the ratio by a slew rate factor to reduce the impact of high speed transient flux changes.

In another embodiment, a system is provided that includes a flux observer module and a magnet strength module. The flux observer module includes one or more processors configured by programming instructions encoded on non-transient computer readable media. The flux observer module is configured to receive a motor current measurement, a motor reference voltage or measured voltage, and an estimated temperature from the electric motor, determine a reference flux linkage estimate ($\lambda_{pm,ref}$) from a lookup table based on the motor current measurement and the estimated temperature, determine a back-EMF (electromotive force) estimate based on the motor current measurement, the motor voltage and the estimated temperature, and determine an observed flux linkage estimate ($\lambda_{pm,obs}$) from the back-EMF estimate. The magnet strength module includes one or more processors configured by programming instructions encoded on non-transient computer readable media. The magnet strength module is configured to determine a magnetic strength as a ratio of the observed flux linkage estimate to the reference flux linkage estimate and determine that a rotor magnet has been demagnetized to an unacceptable level when the magnetic strength is below a threshold level.

In one embodiment, the flux observer module is configured to determine a reference flux linkage estimate ($\lambda_{pm,ref}$) using a pre-defined flux lookup table and a temperature coefficient.

In one embodiment, to determine a reference flux linkage estimate ($\lambda_{pm,ref}$) the flux observer module is configured to select an entry from a lookup table wherein a d-axis current ($i_d$) is equal to zero and a q-axis current ($i_q$) is equal to the amplitude of a stator excitation current ($I_{ss}$).

In one embodiment, to determine a reference flux linkage estimate ($\lambda_{pm,ref}$) the flux observer module is configured to multiply the selected entry from the lookup table by a temperature coefficient ($B_r$ coeff), wherein the $B_r$ coeff is calculated using a measured magnet material property from the rotor magnet.

In one embodiment, to determine the back-EMF estimate the flux observer module is configured to calculate a flux increment based on the motor current measurement, the motor voltage, and the estimated temperature, calculate a flux error by differencing an estimated flux and a measured flux, and determine the back-EMF estimate using the calculated flux increment and the calculated flux error.

In one embodiment, to determine the observed flux linkage estimate ($\lambda_{pm,obs}$) using the back-EMF estimate, the flux observer module is configured to determine the observed flux linkage estimate using a d-axis back-EMF voltage estimate in the synchronously rotating reference frame ($\hat{e}^r_{ds}$) and a q-axis back-EMF voltage estimate in the synchronously rotating reference frame ($\hat{e}^r_{qs}$).

In one embodiment, the flux observer module is configured to determine the observed flux linkage estimate ($\lambda_{pm,obs}$) by $\lambda_{pm,obs} = \sqrt{(\hat{e}^r_{ds})^2 + (\hat{e}^r_{qs})^2}/\omega_e$ wherein $\omega_e$ is the electrical angular speed.

In one embodiment, to determine the magnetic strength as a ratio of the observed flux linkage estimate to the reference flux linkage estimate the magnet strength module is configured to multiply the ratio by a slew rate factor to reduce the impact of high speed transient flux changes.

In another embodiment, a vehicle is provided that includes an electric permanent magnet motor and a controller. The controller includes one or more processors and non-transient computer readable media encoded with programming instructions. The controller is configured to receive a motor current measurement, a motor reference voltage or measured voltage, and an estimated temperature from the electric permanent magnet motor, determine a reference flux linkage estimate ($\lambda_{pm,ref}$) from a lookup table based on the motor current measurement and the estimated temperature, determine a back-EMF (electromotive force) estimate based on the motor current measurement, the motor voltage and the estimated temperature, determine an observed flux linkage estimate ($\lambda_{pm,obs}$) from the back-EMF estimate, determine a magnetic strength as a ratio of the observed flux linkage estimate to the reference flux linkage estimate, determine that a rotor magnet has been demagnetized to an unacceptable level when the magnetic strength is below a threshold level, and set a diagnostic trouble code in the vehicle when it has been determined that the rotor magnet has been demagnetized to an unacceptable level.

In one embodiment, to determine a reference flux linkage estimate ($\lambda_{pm,ref}$) the controller is configured to select an entry from a lookup table wherein a d-axis current ($i_d$) is equal to zero and a q-axis current ($i_q$) is equal to the amplitude of a stator excitation current ($I_{ss}$).

In one embodiment, to determine a reference flux linkage estimate ($\lambda_{pm,ref}$) the controller is configured to multiply the selected entry from the lookup table by a temperature coefficient ($B_r$ coeff), wherein the $B_r$ coeff is calculated using a measured magnet material property from the rotor magnet.

In one embodiment, the controller is configured to determine the observed flux linkage estimate ($\lambda_{pm,obs}$) by $\lambda_{pm,obs} = \sqrt{(\hat{e}^r_{ds})^2 + (\hat{e}^r_{qs})^2}/\omega_e$ wherein $\hat{e}^r_{ds}$ is a d-axis back-EMF voltage estimate in the synchronously rotating reference frame, $\hat{e}^r_{qs}$ is a q-axis back-EMF voltage estimate in the synchronously rotating reference frame, and $\omega_e$ is an electrical angular speed.

BRIEF DESCRIPTION OF THE DRAWINGS

The exemplary embodiments will hereinafter be described in conjunction with the following drawing figures, wherein like numerals denote like elements, and wherein.

DETAILED DESCRIPTION

Figure 1:
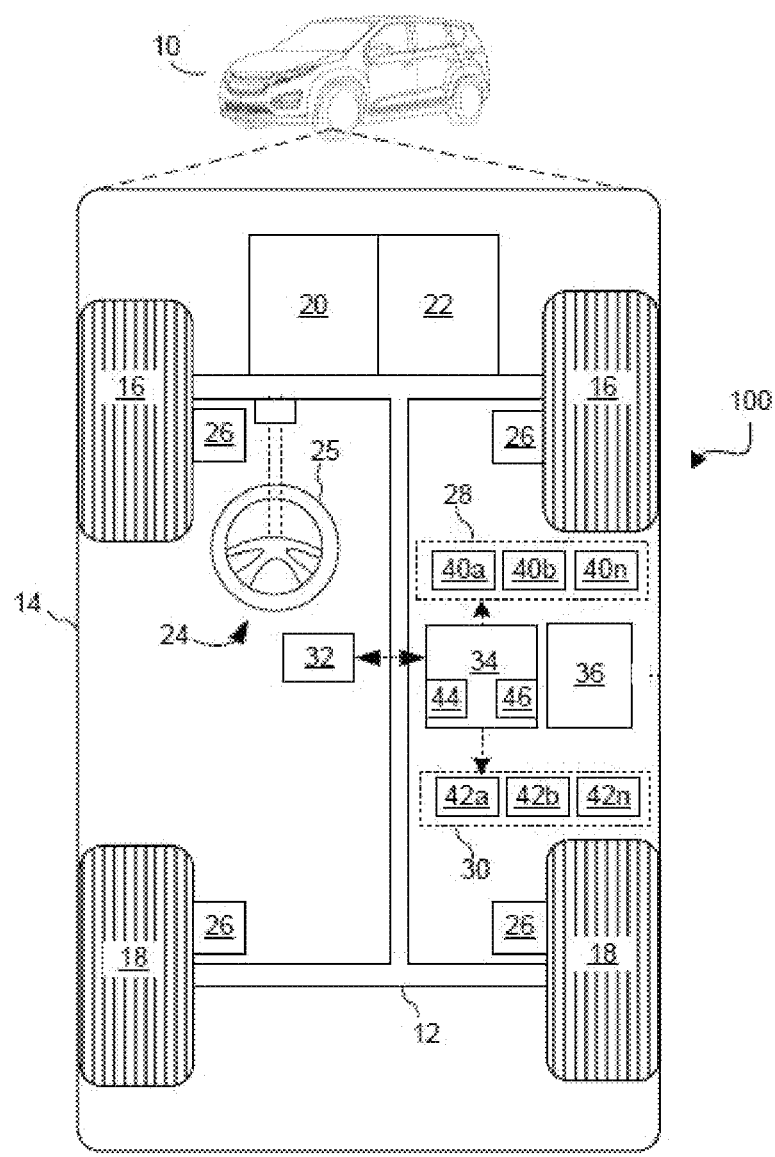
FIG. 1 is a block diagram depicting an example vehicle that may include a magnetization state estimating system, in accordance with an embodiment.

The following detailed description is merely exemplary in nature and is not intended to limit the application and uses. Furthermore, there is no intention to be bound by any expressed or implied theory presented in the preceding technical field, background, summary, or the following detailed description. As used herein, the term "module" refers to any hardware, software, firmware, electronic control component, processing logic, and/or processor device, individually or in any combination, including without limitation: application specific integrated circuit (ASIC), a field-programmable gate-array (FPGA), an electronic circuit, a processor (shared, dedicated, or group) and memory that executes one or more software or firmware programs, a combinational logic circuit, and/or other suitable components that provide the described functionality.

Embodiments of the present disclosure may be described herein in terms of functional and/or logical block components and various processing steps. It should be appreciated that such block components may be realized by any number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present disclosure may be practiced in conjunction with any number of systems, and that the systems described herein is merely exemplary embodiments of the present disclosure.

The subject matter described herein discloses apparatus, systems, techniques and articles for estimating the magnetization state of magnets in a permanent magnet motor by observing magnet flux as a state variable using a flux observer. The described techniques provide a method for online monitoring magnet flux degradation in a permanent magnet motor. The flux observer based method can provide an online monitoring capability for monitoring magnet flux degradation to allow for the determination of whether a rotor magnet is irreversibly demagnetized. The impacts of parameter sensitivity and temperature variation may be minimized by incorporating the saturation effect based on a pre-defined flux lookup table and by updating rotor temperature using a temperature estimator. The described techniques may provide a magnet flux estimation with an error not greater than 3% by including the saturation effect and magnet temperature variation using a pre-defined flux lookup table (LUT) and temperature estimator, respectively. Through the incorporation of magnet temperature variation, the technique may detect irreversible demagnetization and distinguish between an overcurrent shutdown condition and a shutdown condition to avoid demagnetization.

FIG. 1 is a block diagram depicting an example vehicle that may include a magnetization state estimating system 100. In general, the magnetization state estimating system (or simply "system") 100 estimates the magnetization state of a magnet in a permanent magnet (PM) motor by observing magnet flux as a state variable and provides an alert when the magnetization state falls below a predetermined level.

As depicted in FIG. 1, the vehicle 10 generally includes a chassis 12, a body 14, front wheels 16, and rear wheels 18. The body 14 is arranged on the chassis 12 and substantially encloses components of the vehicle 10. The body 14 and the chassis 12 may jointly form a frame. The wheels 16-18 are each rotationally coupled to the chassis 12 near a respective corner of the body 14. The vehicle 10 is depicted in the illustrated embodiment as a passenger car, but it should be appreciated that any other vehicle, including motorcycles, trucks, sport utility vehicles (SUVs), recreational vehicles (RVs), marine vessels, aircraft, etc., can also be used.

As shown, the vehicle 10 generally includes a propulsion system 20, a transmission system 22, a steering system 24, a brake system 26, a sensor system 28, an actuator system 30, at least one data storage device 32, at least one controller 34, and a communication system 36. The propulsion system 20 may, in this example, includes an electric machine such as a permanent magnet (PM) motor. The transmission system 22 is configured to transmit power from the propulsion system 20 to the vehicle wheels 16 and 18 according to selectable speed ratios.

The brake system 26 is configured to provide braking torque to the vehicle wheels 16 and 18. Brake system 26 may, in various embodiments, include friction brakes, brake by wire, a regenerative braking system such as an electric machine, and/or other appropriate braking systems.

The steering system 24 influences a position of the vehicle wheels 16 and/or 18. While depicted as including a steering wheel 25 for illustrative purposes, in some embodiments contemplated within the scope of the present disclosure, the steering system 24 may not include a steering wheel.

The sensor system 28 includes one or more sensing devices 40a-40n that sense observable conditions of the exterior environment and/or the interior environment of the vehicle 10 and generate sensor data relating thereto.

The actuator system 30 includes one or more actuator devices 42a-42n that control one or more vehicle features such as, but not limited to, the propulsion system 20, the transmission system 22, the steering system 24, and the brake system 26. In various embodiments, the vehicle 10 may also include interior and/or exterior vehicle features not illustrated in FIG. 1, such as various doors, a trunk, and cabin features such as air, music, lighting, touch-screen display components, and the like.

The data storage device 32 stores data for use in controlling the vehicle 10. The data storage device 32 may be part of the controller 34, separate from the controller 34, or part of the controller 34 and part of a separate system.

The controller 34 includes at least one processor 44 and a computer-readable storage device or media 46. The processor 44 may be any custom-made or commercially available processor, a central processing unit (CPU), a graphics processing unit (GPU), an application specific integrated circuit (ASIC) (e.g., a custom ASIC implementing a neural network), a field programmable gate array (FPGA), an auxiliary processor among several processors associated with the controller 34, a semiconductor-based microprocessor (in the form of a microchip or chip set), any combination thereof, or generally any device for executing instructions.

The computer readable storage device or media 46 may include volatile and nonvolatile storage in read-only memory (ROM), random-access memory (RAM), and keep-alive memory (KAM), for example. KAM is a persistent or non-volatile memory that may be used to store various operating variables while the processor 44 is powered down. The computer-readable storage device or media 46 may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by the controller 34 in controlling the vehicle 10. In various embodiments, controller 34 is configured to implement a lane change speed management system as discussed in detail below.

The instructions may include one or more separate programs, each of which comprises an ordered listing of executable instructions for implementing logical functions. The instructions, when executed by the processor 44, receive and process signals (e.g., sensor data) from the sensor system 28, perform logic, calculations, methods and/or algorithms for automatically controlling the components of the vehicle 10, and generate control signals that are transmitted to the actuator system 30 to automatically control the components of the vehicle 10 based on the logic, calculations, methods, and/or algorithms. Although only one controller 34 is shown in FIG. 1, embodiments of the vehicle 10 may include any number of controllers 34 that communicate over any suitable communication medium or a combination of communication mediums and that cooperate to process the sensor signals, perform logic, calculations, methods, and/or algorithms, and generate control signals to automatically control features of the vehicle 10.

Figure 2:
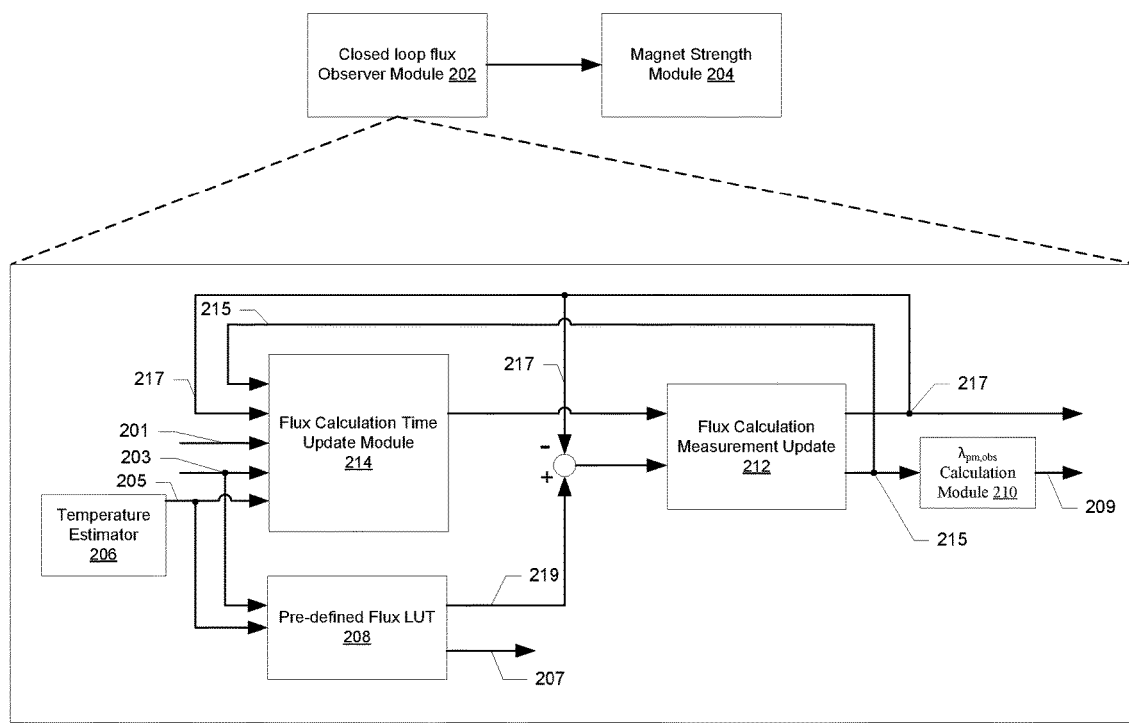
FIG. 2 is a block diagram depicting an example closed-loop flux observer module that may be used in a magnetization state estimating system, in accordance with an embodiment.

FIG. 2 is a block diagram depicting an example magnetization state estimating system 100. The example magnetization state estimating system 100 includes a closed-loop flux observer module 202 and a magnet strength module 204. The example closed-loop flux observer module 202 is configured to calculate a reference PM flux ($\lambda_{pm,ref}$) and a PM flux estimate ($\lambda_{pm,obs}$). The example magnet strength module 204 is configured to determine a magnet strength based on the reference PM flux ($\lambda_{pm,ref}$) and the PM flux estimate ($\lambda_{pm,obs}$). The example magnet strength module 204 is further configured to determine if the magnet strength is below a threshold level, set a diagnostic trouble code if the magnet strength is below the threshold level, and report that the magnet strength passes a magnet strength test when the magnet strength is above the threshold level.

The example closed-loop flux observer module 202 receives a direct axis (d-axis) and quadrature axis (q-axis) voltage (e.g., reference voltage or measured voltage) in the synchronously rotating reference frame ($v^r_{ds}$, $v^r_{qs}$) 201, a d-axis and q-axis (dq) current measurement in the synchronously rotating reference frame ($i^r_{ds}$, $i^r_{qs}$) 203, and a stator temperature estimate 205 (e.g., from a temperature estimator 206) as inputs and provides a reference PM flux ($\lambda_{pm,ref}$) 207 derived from a pre-defined flux look up table (LUT) 208 and a flux observer PM flux estimate ($\lambda_{pm,obs}$) 209 derived from a flux estimating module 210 as outputs.

The example closed-loop flux observer module 202 also includes a flux calculation measurement update module 212 that receives a calculated flux increment 211 and a flux error 213 as inputs and computes and outputs dq back-EMF voltage estimates in the synchronously rotating reference frame ($\hat{e}^r_{ds}$ and $\hat{e}^r_{qs}$) 215 and an estimated dq flux in the synchronously rotating reference frame $(\hat{\lambda}^r_d - \hat{\lambda}^r_{pm}, \hat{\lambda}^r_q)$ 217. The flux error 213 is determined by subtracting the estimated dq flux 217 in the synchronously rotating reference frame from a measured flux 219 derived from the LUT 208. The calculated flux increment 211 is determined by a flux calculation time update module 214, which receives as inputs the dq voltage (e.g., reference voltage or measured voltage) in the synchronously rotating reference frame $(v^r_{ds}, v^r_{qs})$ 201, the dq current measurement in the synchronously rotating reference frame $(i^r_{ds}, i^r_{qs})$ 203, the rotor temperature estimate 205, the dq back-EMF voltage estimates in the synchronously rotating reference frame $(\hat{e}^r_{ds}$ and $\hat{e}^r_{qs})$ 215, and the estimated dq flux 217 in the synchronously rotating reference frame.

The example closed-loop flux observer module 202 is based on the classical state equations of a PM machine:

$$\frac{d\hat{x}}{dt} = \hat{A}\hat{x} + u + L(x - \hat{x}) \text{ which yields}$$

$$\frac{d}{dt}\begin{bmatrix} \hat{\lambda}^r_{ds} - \hat{\lambda}_{pm} \\ \hat{\lambda}^r_{qs} \\ \hat{e}^r_{ds} \\ \hat{e}^r_{qs} \end{bmatrix} = \underbrace{\begin{bmatrix} 0 & \omega_r & 1 & 0 \\ -\omega_r & 0 & 0 & -1 \\ 0 & 0 & 0 & 0 \\ 0 & 0 & 0 & 0 \end{bmatrix} \begin{bmatrix} \hat{\lambda}^r_{ds} - \hat{\lambda}_{pm} \\ \hat{\lambda}^r_{qs} \\ \hat{e}^r_{ds} \\ \hat{e}^r_{qs} \end{bmatrix} + \begin{bmatrix} v^r_{ds} - r_s i^r_{ds} \\ v^r_{qs} - r_s i^r_{qs} \\ 0 \\ 0 \end{bmatrix} +}_{\text{calculated flux increment (211)}}$$

$$\underbrace{\begin{bmatrix} 0 \\ -\omega_r \lambda_{pm,ref} \\ 0 \\ 0 \end{bmatrix}}_{\text{reference PM flux (207)}} + \begin{bmatrix} L_{11} & L_{12} \\ L_{21} & L_{22} \\ L_{31} & L_{32} \\ L_{41} & L_{42} \end{bmatrix} \underbrace{\begin{bmatrix} (\lambda^r_{ds} - \lambda_{pm,ref}) - (\hat{\lambda}^r_{ds} - \hat{\lambda}_{pm}) \\ \lambda^r_{qs} - \hat{\lambda}^r_{qs} \end{bmatrix}}_{\text{flux error (213)}}$$

where symbols with a hat above the symbol (e.g., ê) represent an estimated value, symbols without a hat above the symbol (e.g., e) represent a measured value, $\lambda^r_{ds}$ and $\lambda^r_{qs}$ are the dq flux linkages in the synchronously rotating reference frame, $\lambda_{pm}$ is the magnet flux linkage, $\omega_r$ is the rotor angular speed, $\omega_e$ is the electrical angular speed, $r_s$ is the stator resistance, $i^r_{ds}$ and $i^r_{qs}$ are the dq currents in the synchronously rotating reference frame, $e^r_{ds}$ and $e^r_{qs}$ are the dq back-EMF voltages in the synchronously rotating reference frame, and L matrix is the observer gains.

In this example, the LUT-based reference PM flux $(\lambda_{pm,ref})$ is equal to the d-axis Flux LUT value $(\Psi_{d\_LUT})$ with the d-axis current $(i_d)$ equal to zero and the q-axis current $(i_q)$ equal to the amplitude of stator excitation current $(I_{ss})$ multiplied by the thermal coefficient of remanence ($B_r$ coeff). The reference PM flux $(\lambda_{pm,ref})$, therefore, may be calculated using the following formula: $\lambda_{pm,ref} = \Psi_{d\_LUT}(i_d = 0, i_q = I_{ss}) * B_r$ coeff. The $B_r$ coeff accounts for the temperature effect on magnet strength and is set based on measured values for the actual magnet being monitored. In this example, the magnet temperature coefficient ($B_r$ coeff) is calculated using a pre-defined measured magnet material property from the rotor magnet, rather than from directly measuring back-EMF voltages from an experimental machine thereby reducing calibration effort.

Because magnet flux is sensitive to the change in saturation and temperature, the estimation error from this sensitivity is minimized, in this example, by incorporating the saturation effect caused by both d- and q-axis currents, and by updating the rotor temperature using the temperature estimator. This is accomplished by determining the magnet flux linkage $\lambda_{pm}$ as a function of dq currents and rotor temperature. Also, in this example, the flux observer PM flux estimate $(\lambda_{pm,obs} = \sqrt{(\hat{e}^r_{ds})^2 + (\hat{e}^r_{qs})^2}/\omega_e)$ is calculated based on d-axis and q-axis back-EMF voltage estimates in the synchronously rotating reference frame ($\hat{e}^r_{ds}$ and $\hat{e}^r_{qs}$).

An example system 100 may include any number of additional sub-modules embedded within the controller 34 which may be combined and/or further partitioned to similarly implement systems and methods described herein. Additionally, inputs to the system 100 may be received from the sensor system 28, received from other control modules (not shown) associated with the vehicle 10, and/or determined/modeled by other sub-modules (not shown) within the controller 34 of FIG. 1. Furthermore, the inputs might also be subjected to preprocessing, such as sub-sampling, noise-reduction, normalization, feature-extraction, missing data reduction, and the like.

Figure 3:
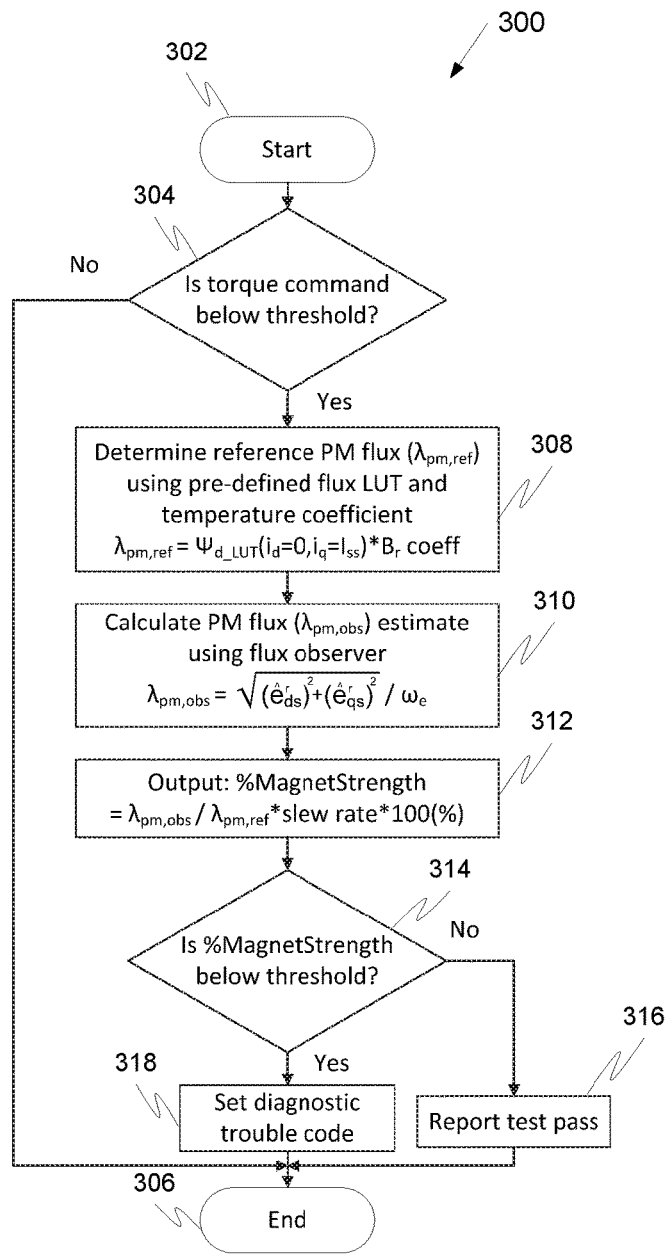
FIG. 3 is a process flow chart depicting an example process in a magnetization state estimating system for testing the magnetization state of magnets in a PM motor, in accordance with an embodiment.

FIG. 3 is a process flow chart depicting an example process 300 in a magnetization state estimating system 100 for testing the magnetization state of magnets in a PM motor. The order of operation within the process is not limited to the sequential execution as illustrated in the figure, but may be performed in one or more varying orders as applicable and in accordance with the present disclosure. In various embodiments, the process can be scheduled to run based on one or more predetermined events, and/or can run continuously during operation of the vehicle 10.

When the example process 300 is initiated (operation 302), a decision is made regarding whether the requested torque from an engine torque command for the electric motor being monitored is below a threshold level (decision 304). If the requested torque is not below a threshold level (no at decision 304), the example process 300 is not used at that torque request level and ends (operation 306).

If the requested torque is below a threshold level (yes at decision 304), the example process 300 includes determining the reference PM flux $(\lambda_{pm,ref})$ using a pre-defined flux LUT measurement and temperature coefficient ($B_r$ coeff) (operation 308). In this example, the PM flux $(\lambda_{pm,ref})$ is determined in accordance with the following formula: $\lambda_{pm,ref} = \Psi_{d\_LUT}(i_d = 0, i_q = I_{ss}) * B_r$ coeff. In this example, dq currents are updated at a relatively high rate (e.g., 2 μs), whereas rotor temperature may be updated at a slower rate such as at a 25 ms interval. The impacts of parameter sensitivity and temperature variation is minimized, in this example, by incorporating the saturation effect based on a pre-defined flux lookup table and by updating the rotor temperature using a temperature estimator.

The example process 300 also includes calculating the PM flux estimate $(\lambda_{pm,obs})$ using a flux observer (operation 310). In this example, the PM flux estimate $(\lambda_{pm,obs})$ is determined in accordance with the following formula: $(\lambda_{pm,obs} = \sqrt{(\hat{e}^r_{ds})^2 + (\hat{e}^r_{qs})^2}/\omega_e)$, wherein ($\hat{e}^r_{ds}$ and $\hat{e}^r_{qs}$) are dq back-EMF voltage estimates in the synchronously rotating reference frame and $\omega_e$ is the electrical angular speed.

The example process 300 includes calculating a magnet strength for the rotor magnet in the electrical motor (operation 312). The magnet strength may be determined by the following formula: magnet strength=$\lambda_{pm,obs}/\lambda_{pm,ref}$*slew rate*100. The slew rate is a factor set to suppress undesirable transient effects by reducing the impact of or filtering out high speed transient flux changes such as a sudden spike in the magnetic flux estimation.

A decision is made regarding whether the calculated magnet strength is below a threshold level (decision 314). If the calculated magnet strength is above the threshold level (no at decision 314), the magnetization test is deemed to have been passed (operation 316). The process may then end (operation 306). If the calculated magnet strength is below the threshold level (yes at decision 314), the magnetization test is deemed to have not passed and a diagnostic trouble code in the vehicle may be set (operation 318). The process may then end (operation 306).

Figure 4:
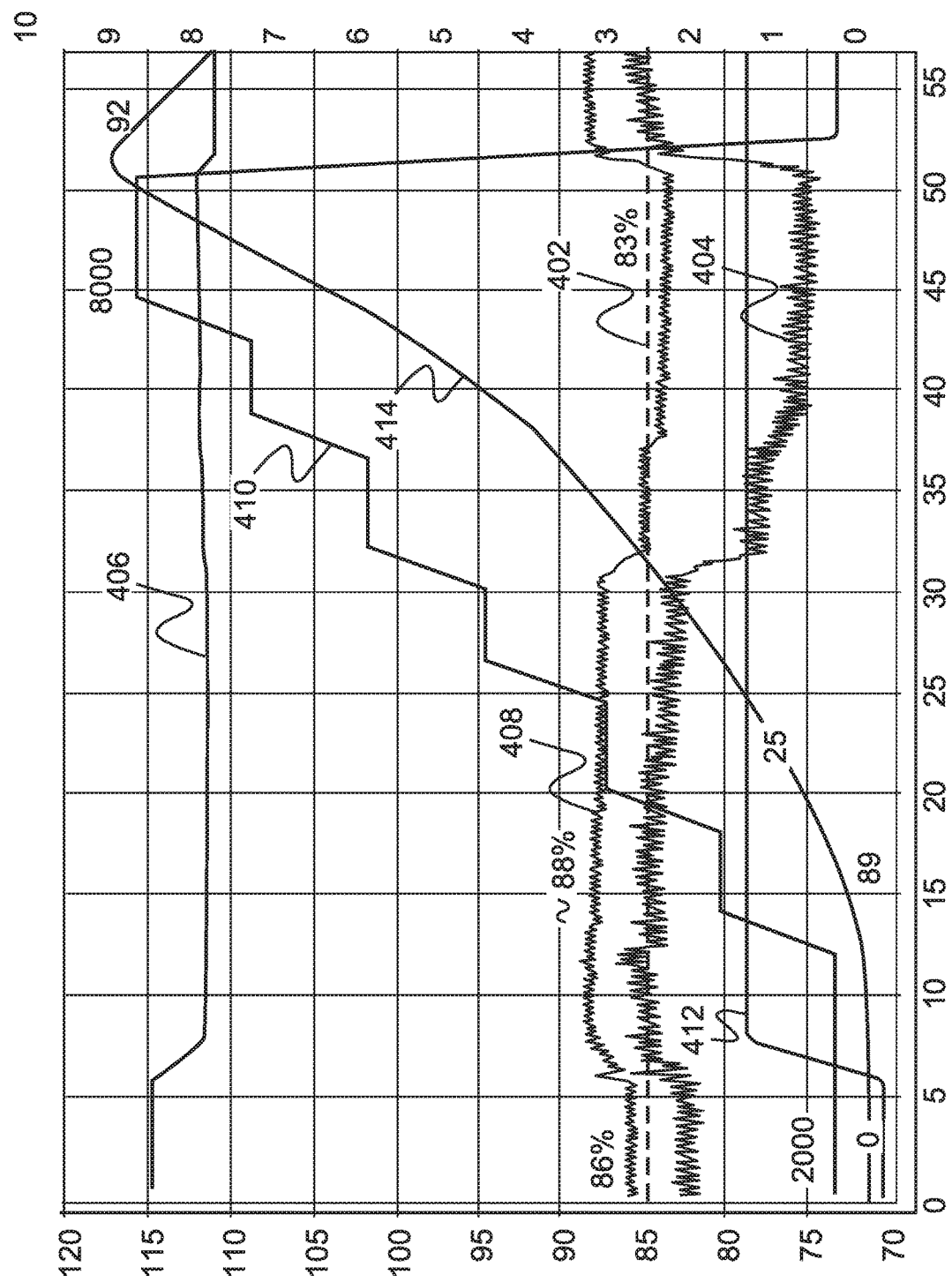
FIG. 4 is a graph illustrating the accuracy of an example magnetization state estimating system under certain conditions, in accordance with an embodiment.

FIG. 4 is a graph illustrating the accuracy of an example magnetization state estimating system under certain conditions. The graph shows a line 402 identifying the true magnetic power of the magnets at 85%, a signal 404 showing the PM flux estimate ($\lambda_{pm,obs}$) during test conditions, a signal 406 showing the reference PM flux ($\lambda_{pm,ref}$) during test conditions, and a signal 408 showing the predicted magnet strength during test conditions. In this test example, the predicted magnet strength varies at most by 3% from the true magnet strength.

The graph also indicates the following test conditions. The speed command 410 is stepped from 2000 rpms to 8000 rpms during the test. The torque command 412 has one step from 0 Nm to 25 Nm. The temperature curve 414 varies from 89 C to 92 C.

Described herein are techniques for monitoring magnet flux degradation in a permanent magnet motor. The apparatus, systems, techniques and articles provide a flux observer that may measure magnet strength with an error of not more than 3%. The flux observer may measure magnet strength with an error of not more than 3% by accounting for the saturation effect and magnet temperature variation using a pre-defined flux lookup table (LUT) and a temperature estimator, respectively. The incorporation of magnet temperature variation may also enable the flux observer to detect irreversible demagnetization and distinguish between an overcurrent shutdown and a shutdown to avoid demagnetization.

The apparatus, systems, techniques and articles allow for an online monitoring capability for monitoring magnet flux degradation to determine if rotor magnets are irreversibly demagnetized. The apparatus, systems, techniques and articles may provide an online demagnetization detection capability based on a software algorithm without the need to add additional sensors and/or devices. The apparatus, systems, techniques and articles may provide enhanced PM flux information to the other control rings, thus allowing for more robust motor control under a demagnetization condition.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A method in a vehicle having an electric motor, the method comprising:
    measuring, using one or more sensors, a motor current measurement, a motor reference voltage or measured voltage, and an estimated temperature from the electric motor;
    determining, using a motor controller, a reference flux linkage estimate $\lambda_{pm,ref}$) from a lookup table based on the motor current measurement and the estimated temperature;
    determining, using the motor controller, a back-EMF (electromotive force) estimate based on the motor current measurement, the motor voltage and the estimated temperature;
    determining, using the motor controller, an observed flux linkage estimate ($\lambda_{pm,obs}$) from the back-EMF estimate;
    determining, using the motor controller, a magnetic strength as a ratio of the observed flux linkage estimate to the reference flux linkage estimate; and
    setting a diagnostic trouble code indicating that a rotor magnet in the electric motor is not performing to operational standards when the magnetic strength is below a threshold level.

2. The method of claim 1, wherein determining a reference flux linkage estimate ($\lambda_{pm,ref}$) from a lookup table based on the motor current measurement and the estimated temperature comprises determining the reference flux linkage estimate using a pre-defined flux lookup table and a temperature coefficient.

3. The method of claim 1, wherein determining a reference flux linkage estimate ($\lambda_{pm,ref}$) comprises selecting an entry from a lookup table wherein a d-axis current ($i_d$) is equal to zero and a q-axis current ($i_q$) is equal to the amplitude of a stator excitation current ($I_{ss}$).

4. The method of claim 3, wherein determining a reference flux linkage estimate ($\lambda_{pm,ref}$) comprises multiplying the selected entry from the lookup table by a temperature coefficient ($B_r$coeff) wherein the $B_r$ coeff is calculated using a measured magnet material property from the rotor magnet.

5. The method of claim 1, wherein determining the back-EMF estimate based on the motor current measurement, the motor voltage and the estimated temperature comprises:
    calculating a flux increment based on the motor current measurement, the motor voltage, and the estimated temperature;
    calculating a flux error by differencing an estimated flux and a measured flux; and
    determining the back-EMF estimate using the calculated flux increment and the calculated flux error.

6. The method of claim 1, wherein determining the observed flux linkage estimate ($\lambda_{pm,obs}$) using the back-EMF estimate comprises determining the observed flux linkage estimate using a d-axis back-EMF voltage estimate in the synchronously rotating reference frame ($\hat{e}^r_{ds}$) and a q-axis back-EMF voltage estimate in the synchronously rotating reference frame ($\hat{e}^r_{qs}$).

7. The method of claim 6, wherein the observed flux linkage estimate ($\lambda_{pm,obs}$) is determined by $\lambda_{pm,obs} = \sqrt{(\hat{e}^r_{ds})^2 + (\hat{e}^r_{qs})^2}/\omega_e$ wherein $\omega_e$ is the electrical angular speed.

8. The method of claim 1, wherein determining the magnetic strength as a ratio of the observed flux linkage estimate to the reference flux linkage estimate comprises multiplying the ratio by a slew rate factor to reduce the impact of high speed transient flux changes.

9. A system comprising:
one or more sensors, configured to measure a motor current measurement, a motor reference voltage or measured voltage, and an estimated temperature from an electric motor;
a flux observer module comprising one or more processors configured by programming instructions encoded on non-transient computer readable media, the flux observer module configured to:
- determine a reference flux linkage estimate ($\lambda_{pm,ref}$) from a lookup table based on the motor current measurement and the estimated temperature;
- determine a back-EMF (electromotive force) estimate based on the motor current measurement, the motor voltage and the estimated temperature; and
- determine an observed flux linkage estimate ($\lambda_{pm,obs}$) from the back-EMF estimate; and a magnet strength module comprising one or more processors configured by programming instructions encoded on non-transient computer readable media, the magnet strength module configured to:
- determine a magnetic strength as a ratio of the observed flux linkage estimate to the reference flux linkage estimate; and
- cause a diagnostic trouble code to be set indicating that a rotor magnet in the electric motor is not performing to operational standards when the magnetic strength is below a threshold level.

10. The system of claim 9, wherein the flux observer module is configured to determine a reference flux linkage estimate ($\lambda_{pm,ref}$) using a pre-defined flux lookup table and a temperature coefficient.

11. The system of claim 9, wherein to determine a reference flux linkage estimate ($\lambda_{pm,ref}$) the flux observer module is configured to select an entry from a lookup table wherein a d-axis current ($i_d$) is equal to zero and a q-axis current ($i_q$) is equal to the amplitude of a stator excitation current ($I_{ss}$).

12. The system of claim 11, wherein to determine a reference flux linkage estimate ($\lambda_{pm,ref}$) the flux observer module is configured to multiply the selected entry from the lookup table by a temperature coefficient ($B_r$ coeff), wherein the $B_r$ coeff is calculated using a measured magnet material property from the rotor magnet.

13. The system of claim 9, wherein to determine the back-EMF estimate the flux observer module is configured to:
- calculate a flux increment based on the motor current measurement, the motor voltage, and the estimated temperature;
- calculate a flux error by differencing an estimated flux and a measured flux; and
- determine the back-EMF estimate using the calculated flux increment and the calculated flux error.

14. The system of claim 9, wherein to determine the observed flux linkage estimate ($\lambda_{pm,obs}$) using the back-EMF estimate, the flux observer module is configured to determine the observed flux linkage estimate using a d-axis back-EMF voltage estimate in the synchronously rotating reference frame ($\hat{e}^r_{ds}$) and a q-axis back-EMF voltage estimate in the synchronously rotating reference frame ($\hat{e}^r_{qs}$).

15. The system of claim 14, wherein the flux observer module is configured to determine the observed flux linkage estimate ($\lambda_{pm,obs}$) by $\lambda_{pm,obs} = \sqrt{(\hat{e}^r_{ds})^2 + (\hat{e}^r_{qs})^2}/\omega_e$ wherein $\omega_e$ is the electrical angular speed.

16. The system of claim 9, wherein to determine the magnetic strength as a ratio of the observed flux linkage estimate to the reference flux linkage estimate the magnet strength module is configured to multiply the ratio by a slew rate factor to reduce the impact of high speed transient flux changes.

17. A vehicle, comprising:
an electric permanent magnet motor;
one or more sensors, configured to measure a motor current measurement, a motor reference voltage or measured voltage, and an estimated temperature from the electric motor; and
a controller comprising one or more processors and non-transient computer readable media encoded with programming instructions, the controller configured to:
- determine a reference flux linkage estimate ($\lambda_{pm,ref}$) from a lookup table based on the motor current measurement and the estimated temperature;
- determine a back-EMF (electromotive force) estimate based on the motor current measurement, the motor voltage and the estimated temperature;
- determine an observed flux linkage estimate ($\lambda_{pm,obs}$) from the back-EMF estimate;
- determine a magnetic strength as a ratio of the observed flux linkage estimate to the reference flux linkage estimate;
- set a diagnostic trouble code in the vehicle indicating that a rotor magnet in the electric motor is not performing to operational standards when the magnetic strength is below a threshold level.

18. The vehicle of claim 17, wherein to determine a reference flux linkage estimate ($\lambda_{pm,ref}$) the controller is configured to select an entry from a lookup table wherein a d-axis current ($i_d$) is equal to zero and a q-axis current ($i_q$) is equal to the amplitude of a stator excitation current ($I_{ss}$).

19. The vehicle of claim 17, wherein to determine a reference flux linkage estimate ($\lambda_{pm,ref}$) the controller is configured to multiply the selected entry from the lookup table by a temperature coefficient ($B_r$coeff), wherein the $B_r$ coeff is calculated using a measured magnet material property from the rotor magnet.

20. The vehicle of claim 17, wherein the controller is configured to determine the observed flux linkage estimate ($\lambda_{pm,obs}$) by $\lambda_{pm,obs} = \sqrt{(\hat{e}^r_{ds})^2 + (\hat{e}^r_{qs})^2}/\omega_e$ wherein $\hat{e}^r_{ds}$ is a d-axis back-EMF voltage estimate in the synchronously rotating reference frame, $\hat{e}^r_{qs}$ is a q-axis back-EMF voltage estimate in the synchronously rotating reference frame, and $\omega_e$ is an electrical angular speed.

* * * * *

UNITED STATES PATENT AND TRADEMARK OFFICE
CERTIFICATE OF CORRECTION

PATENT NO. : 10,295,599 B2
APPLICATION NO. : 15/674804
DATED : May 21, 2019
INVENTOR(S) : Gilsu Choi, Anno Yoo and Dwarakanath V. Simili Page 1 of 1

It is certified that error appears in the above-identified patent and that said Letters Patent is hereby corrected as shown below:

In the Claims

Column 11, Line 31, "(80 pm,ref)" should be changed to --($\lambda$pm,ref)--

Signed and Sealed this
Twelfth Day of May, 2020

Andrei Iancu
*Director of the United States Patent and Trademark Office*